United States Patent [19]
Ivanov et al.

[11] Patent Number: 5,841,322
[45] Date of Patent: Nov. 24, 1998

[54] PHASE DETECTOR USING CARRIER SUPPRESSION AND OSCILLATOR USING THE PHASE DETECTOR

[76] Inventors: Eugene Nikolay Ivanov, 112 Brompton Road, Wembley Downs, Western Australia 6019; Michael Edmund Tobar, 14 Karo Place, Duncraig, Western Australia 6029; Richard Alec Woode, 86 Murchison Street, Shenton Park, Western Australia 6008, all of Australia

[21] Appl. No.: 755,704

[22] Filed: Nov. 25, 1996

Related U.S. Application Data

[63] Continuation-in-part of PCT/AU95/00306, May 25, 1995, abandoned.

[30] Foreign Application Priority Data

May 25, 1994 [AU] Australia ................................. PM5870

[51] Int. Cl.$^6$ .............................. H03B 1/04; H03D 13/00
[52] U.S. Cl. .............................. 331/1 R; 327/7; 329/346; 331/96; 331/105
[58] Field of Search ............................ 331/1 R, 96, 105; 329/345, 346; 327/7, 8

[56] References Cited

U.S. PATENT DOCUMENTS

| | | | |
|---|---|---|---|
| 4,555,678 | 11/1985 | Galani et al. | 331/1 A |
| 4,692,714 | 9/1987 | Galani | 331/1 R |
| 5,032,800 | 7/1991 | Galani et al. | 331/1 R |
| 5,036,299 | 7/1991 | Dick et al. | 331/2 J |

OTHER PUBLICATIONS

Sann, "The Measurement of Near–Carrier Noise in Microwave Amplifiers", IEEE Transactions on Microwave Theory and Techniques, vol. MTT–16, No. 9, Sep. 1968, pp. 761–766.

"Analysis and Design of a Single–Resonator GaAs FET Oscillator with Noise Degeneration," Galani Z. et al., IEEE Transactions on Microwave Theory and Techniques, vol. MTT–32 No. 12, Dec. 1984, pp. 1556–1564.

"A Highly Stabilized GaAs FET Oscillator Using a Dielectric Resonator Feedback Circuit in 9–14 Ghz," Ishihara O et al., IEEE Transactions on Microwave Theory and Techniques, vol. MTT–28, No. 8, Aug. 1980, pp. 817–824.

"Microwave Frequency Discriminator with a Cooled Sapphire Resonator for Ultra–Low Phase Noise," Santiago DG and Dick GJ, Proceedings of the 1992 IEEE Frequency Control Symposium, pp. 176–182.

"Measurement and Analysis of a Microwave Oscillator Stabilized by a Sapphire Dielectric Ring Resonator for Ultra–Low Noise," Dick GJ and Saunders J, IEEE Transactions on Ultrasonics, Ferroelectrics, and Frequency Control, vol. 37, No. 5, Sep. 1990, pp. 339–346.

"Closed Loop Tests of the NASA Sapphire Phase Stabilizer," Santiago DG and Dick GJ, Proceedings of the 1993 IEEE Frequency Control Symposium, pp. 774–778.

"High Spectral Purity X–Band Source," Walls FL and Felton CM, Proceedings of the 1990 IEEE Frequency Control Symposium, pp. 542–547.

"Low Phase Noise Sapphire Disk Dielectric Resonator Oscillator with Combined Stabilization," Tsarapkin DP, Proceedings of the 1994 IEEE Frequency Control Symposium, pp. 451–458.

(List continued on next page.)

*Primary Examiner*—Siegfried H. Grimm

[57] ABSTRACT

A phase detector responsive to a first signal having a carrier frequency and a second signal close to the carrier frequency, including a carrier suppression circuit which produces a carrier suppressed signal from the first and second signals, and a mixer responsive to the carrier suppressed signal and the carrier frequency to produce an output signal corresponding to the phase difference between the first and second signals.

31 Claims, 4 Drawing Sheets

OTHER PUBLICATIONS

"A Microwave System for Measurements of AM and FM Noise Spectra," Ondria JG, IEEE Transactions on Microwave Theory and Techniques, vol. MTT–16, No. 9, Sep. 1968, pp. 767–781.

"Investigations of AM and PM Noise in X–Band Devices," Ascarrunz FG, et al., Proceedings of the 1993 IEEE International Frequency Control Symposium, pp. 303–311.

"Experimental Study of the Noise Phenomena in Microwave Components," Ivanov EN, Proceedings of the 1996 IEEE International Frequency Control Symposium, pp. 858–865.

"Phase Noise and AM Noise Measurements in the Frequency Domain," Lance AL. et al., Infrared and Millimeter Waves, vol. 11, pp. 239–289, 1984.

"New Discriminator Boosts Phase–Noise Testing," Labaar, F, Microwaves, vol. 21, No. 3, Mar. 1982, pp. 65–69.

PHASE DETECTOR USING CARRIER SUPPRESSION AND OSCILLATOR USING THE PHASE DETECTOR

RELATED APPLICATIONS

This is a continuation-in-part of International Application PCT/AU95/00306, with an international filing date of May 25, 1995, now abandoned.

TECHNICAL FIELD

The present invention relates to phase detectors, and particularly to phase detectors in microwave oscillators having a high-Q resonator as a frequency dispersive element in which the phase detector is used to suppress noise close to the carrier frequency in the microwave oscillator.

BACKGROUND ART

Phase detectors have uses in a variety of applications. One such application is microwave oscillators, where phase detectors are used to servo noise close to the carrier frequency from the oscillator.

Microwave oscillators are well known and are used in applications where a high frequency signal source is needed. Two examples of such applications are radar and telecommunications systems, which typically require a signal source with good spectral purity.

Loop oscillators are well known in the art. Loop oscillators typically include a microwave amplifier, a resonator and a phase shifter arranged in a loop. There are limitations to the performance of loop oscillators, such as the limitations imposed by flicker noise in the microwave amplifier. Flicker noise adds noise close to the carrier frequency in the microwave oscillator, which is undesirable in applications requiring a stable frequency source.

Another type of oscillator known in the art is a cavity stabilised oscillator, wherein a frequency source such as an external oscillator or a voltage controlled oscillator, which produce a comparatively noisy signal, is input to a high-Q resonator used as a frequency dispersive element. The resonator acts to filter some of the noise from the frequency source, and the resonator and a detector, such as a phase detector, are used to measure the noise in the frequency source and, based upon that measurement, servo some of the noise from the frequency source.

Both of these types of oscillator have limitations on their performance imposed by the non-ideal nature of the components. There are ways of compensating for these limitations by incorporating a servo circuit to suppress some of the noise.

A paper presented by D. P. Tsarapkin at the 1994 IEEE International Frequency Control Symposium entitled Low phase noise sapphire disk dielectric resonator oscillator with combined stabilization discusses known configurations for suppressing noise in microwave oscillators, some of which have been known for over 20 years.

U.S. Pat. No 4,555,678 in the name of Galani et al discloses a microwave loop oscillator in which a phase detector is used to suppress noise close to the carrier frequency in the oscillator. The oscillator disclosed in Galani provides increased performance characteristics in terms of noise close to the carrier frequency in the loop of the oscillator.

There are limitations to the amount of noise suppression that can be achieved using the disclosure in Galani, however. In practice, the amount of noise suppression is fundamentally limited by the noise in the phase detector, the gain in the servo circuit used to suppress the noise and by noise inherent in the servo circuit.

At present, a significant amount of noise is added by the mixer in phase detectors used in noise suppression circuits. Flicker noise added by the mixer has therefore placed restrictions on the performance of oscillators because of the limitations imposed in suppressing noise. This limitation applies to all types of oscillators incorporating a noise suppression circuit, including loop oscillators and cavity stabilised oscillators.

Throughout the specification, the term "frequency dispersive element" is used to denote an element having a centre frequency, whereby when a signal having a frequency offset from the centre frequency is incident upon the element, the element produces a dispersed signal which has a phase shift relative to the incident signal corresponding to the difference between the frequency of the incident signal and the centre frequency.

SUMMARY OF THE INVENTION

According to one aspect of this invention, there is provided a phase detector responsive to a first signal having a carrier frequency and a second signal, comprising a carrier suppression means responsive to the first and second signals, the second signal having a frequency such that the carrier suppression means produces a carrier suppressed signal from the first and second signals, and a mixing means responsive to the carrier suppressed signal and the carrier frequency to produce an output signal corresponding to the phase difference between the first and second signals.

Preferably, the phase detector further comprises an amplifier arranged between the carrier suppression means and the mixing means.

Preferably, the carrier suppression means comprises a power combiner, a phase shift means and an amplitude matching means, the phase shift means and the amplitude matching means arranged to be operative on the first and second signals before being input to the power combiner such that the power combiner produces the carrier suppressed signal from the first and second signals.

Preferably the amplitude matching means comprises an attenuator.

In one arrangement, the power combiner comprises a 3 dB 90° hybrid.

Preferably the mixing means comprises a double balanced mixer.

In a preferred arrangement, the second signal comprises a signal reflected from a frequency dispersive element in response to the first signal being incident thereon.

In an alternative arrangement the second signal comprises a signal output from a frequency dispersive element in response to the first signal being incident thereon.

Preferably the frequency dispersive element comprises a resonator.

More preferably the resonator is close to critically coupled.

According to a second aspect of this invention, there is provided an oscillator including a phase detector according to the first aspect of the invention, wherein the first signal is a signal in the oscillator, the output signal from the phase detector being fed back to suppress noise close to the carrier frequency in the oscillator.

Preferably the frequency dispersive element forms part of the oscillator.

In one arrangement, the oscillator is a loop oscillator including an amplifier and a phase-shift means responsive to a control signal, the amplifier, the phase-shift means and the frequency dispersive element being arranged in a loop, the output signal from the phase detector being input to an electronic circuit which produces therefrom the control signal for the phase-shift means such that the phase-shift means suppresses noise close to the carrier frequency in the loop oscillator.

In an alternative arrangement the oscillator includes a frequency source responsive to a control signal, the frequency source producing the first signal, wherein the output signal from the phase detector is input to an electronic circuit which produces the control signal for the frequency source, the control signal adjusting the frequency of the frequency source to suppress noise close to the carrier frequency in the frequency source.

Preferably the oscillator is a microwave oscillator.

According to a third aspect of this invention, there is provided a method of detecting a phase difference between a first signal having a carrier frequency and a second signal, comprising the steps of:

adjusting the phase of the first signal and/or the second signal such that, at the carrier frequency, the first and second signals have a predetermined phase difference;

adjusting the amplitudes of the first signal and/or the second signal such that, at the carrier frequency, the first and second signals have substantially equal amplitude;

combining the first and second signals to produce a carrier suppressed signal; and mixing the carrier suppressed signal with the carrier frequency to produce an output signal corresponding to the phase difference between the signals.

Preferably, the method further comprises amplifying the carrier suppressed signal before mixing the same with the carrier frequency.

In a preferred arrangement, the second signal comprises a signal reflected from a frequency dispersive element in response to the first signal being incident thereon.

In an alternative arrangement, the second signal comprises a signal output from a frequency dispersive element in response to the first signal being incident thereon.

Preferably the frequency dispersive element comprises a resonator.

More preferably the resonator is close to critically coupled.

Preferably the phase difference between the first and second signals is adjusted by passing one of the first and second signals through a phase shifter to alter the phase of that signal by a predetermined amount.

Preferably the relative amplitude of the first and second signals is adjusted by passing one of the first and second signals through and attenuator to attenuate the amplitude of that signal by a predetermined amount.

Preferably the first and second signals are combined by passing them through a power combiner, the power combiner producing the carrier suppressed signal from the first and second signals.

Preferably the power combiner comprises a 3 dB 90° hybrid.

BRIEF DESCRIPTION OF THE DRAWINGS

Four embodiments of the present invention will now be described, by way of example, with reference to the accompanying drawings, in which.

DESCRIPTION OF THE BEST MODE OF THE INVENTION

The embodiments are directed towards microwave oscillators which use phase detectors to suppress noise close to the carrier in the microwave oscillator. It should be appreciated, however, that the present invention has application other than in microwave oscillators.

Figure 1:
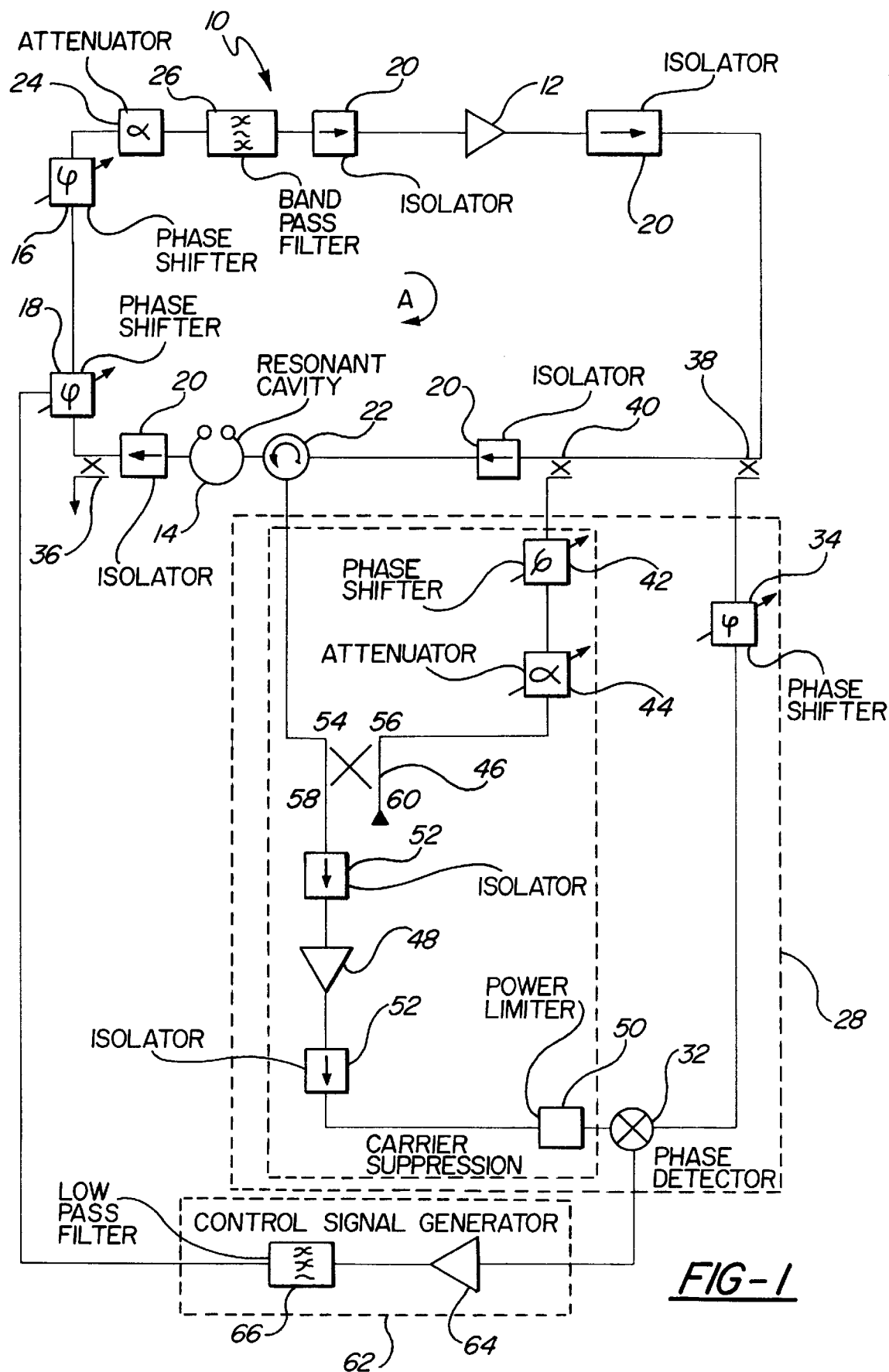
FIG. 1 is a schematic drawing of a loop oscillator incorporating a phase detector according to the first embodiment.

In FIG. 1 of the drawings there is shown a microwave loop oscillator 10 comprising a microwave amplifier 12, a frequency dispersive element in the form of a high-Q resonator 14, phase shifters 16 and 18, isolators 20, a circulator 22, an attenuator 24 and a band pass filter 26 arranged in a loop. The arrow A indicates the direction of flow of microwaves around the oscillator 10.

The band pass filter 26 is used to prohibit the oscillator 10 from operating on spurious modes of the resonator 14. The attenuator 24 is used to ensure the small-signal gain margin is sufficient to ensure oscillation without damaging the microwave amplifier 12 or inducing excess noise in the microwave amplifier 12. The phase shifters 16 and 18 are used to ensure the phase shift around the loop is a multiple of $2\pi$, satisfying the conditions for oscillation.

The phase shifter 18 is controlled by a control signal, for example the phase shifter 18 may comprise a voltage controlled phase shifter.

The resonator 14 has an input coupling close to critical to increase the power dissipated in the resonator 14, which is necessary to improve the noise floor. The critical coupling causes the majority of a signal input to the resonator 14 to be transmitted into the resonator 14 and a small portion of the signal to be reflected from the input. If the carrier frequency of the signal input to the resonator 14 is not equal to a resonant frequency of the resonator 14, the reflected signal will have been phase-shifted by the resonator 14 by an amount corresponding to the difference between the resonant frequency of the resonator 14 and the carrier frequency of the input signal.

The embodiment comprises a phase detector 28 including a carrier suppression means 30, a double balanced mixer 32 and a phase shifter 34.

The carrier suppression means 30 comprises a phase shifter 42, an attenuator 44, a power combiner in the form of a 3 dB 90° hybrid 46, a microwave amplifier 48, a power limiter 50 and isolators 52. The 3 dB 90° hybrid 46 has input ports 54 and 56, and output ports 58 and 60.

The oscillator 10 further comprises couplers 36, 38 and 40. The coupler 36 produces an output signal from the loop. The coupler 36 can be positioned anywhere in the loop. The couplers 38 and 40 produce signals which are portions of the signal in the loop prior to the signal being incident upon the resonator 14.

The signal produced by the coupler 38 passes through the phase shifter 34 and into the mixer 32.

The circulator 22 is preferably located at the input to the resonator 14, such that the reflected signal is directed from the loop into the input port 54 of the 3 dB 90° hybrid 46. The signal produced by the coupler 40 passes through the phase shifter 42, the attenuator 44 and into input port 56 of the 3 dB 90° hybrid 46. The phase shifter 42 and the attenuator 44 are arranged such that, at the centre frequency of the resonator 14, the signals appearing at the input ports 54 and 56 of the 3 dB 90° hybrid have equal amplitude and are in quadrature.

The 3 dB 90° hybrid 46 acts to split the signals present at each of the input ports 54 and 56 equally and directs the split signals to each of the output ports 58 and 60. In doing so, the 3 dB 90° hybrid 46 adds a 90 degree phase shift to the split signal appearing at the output port 60 from the input port 54. Similarly, the 3 dB 90° hybrid 46 adds a 90 degree phase shift to the split signal appearing at the output port 58 from the input port 56. Thus, the split signals from the input ports 54 and 56 are 180 degrees out of phase at the output port 58 and are in phase at the output port 60.

It should be appreciated that other forms of power combiner can be used. For example, a 3 dB 180° hybrid could be used, in which case the two signals appearing at the input ports of the hybrid would need to be in phase. If a 6 dB coupler was used, the two signals input to the coupler would need to be 180° out of phase. The form of power combiner used determines the requirements on the phase difference needed between the two signals input to the power combiner. The important feature is that the input signals have the correct phase difference to enable carrier suppression.

Consequently, the carrier appears at the output port 60 whilst the carrier is suppressed at the output port 58. Carrier suppression of up to 80 dB has been achieved using this circuit. Preferably, the carrier suppression is at least twice the gain of the microwave amplifier 48, so that the microwave amplifier 48 operates in small signal mode to minimise noise produced by the microwave amplifier 48. Since the signal appearing at the output port 58 consists substantially of only the difference between the signal appearing at the input ports 54 and 56, the signal represents the noise in the loop. The signal appearing at the output port 58 is amplified by the microwave amplifier 48, passed through the power limiter 50 and input to the mixer 32. The power limiter 50 is provided to protect the mixer 32 from being damaged by high output power from the microwave amplifier 48 when conditions of carrier suppression are not met. It is anticipated that in some applications the amplifier 48 may be omitted.

Without carrier suppression, the signal appearing at the mixer 32 from the circulator 22 would have been dominated by the carrier, with the noise component of the signal having an amplitude considerably smaller than that of the carrier. The presence of the carrier results in the microwave amplifier 48 and the mixer 32 operating in large signal mode. Large signal mode operation of the microwave amplifier 48 and the mixer 32 causes the microwave amplifier 48 and the mixer 32 to add flicker noise. The flicker noise so added would be detrimental to the operation of the oscillator. Carrier suppression of the signal ensures small signal operation of the microwave amplifier 48, which satisfies the conditions of low noise operation of the mixer 32.

The signal appearing at the output port 60 of the 3 dB 90° hybrid 46 contains predominantly the carrier in the signal. The output port 60 can be coupled to a balanced load to absorb the signal appearing at the output port 60. Alternatively, the signal appearing at the output port 60 can be used to monitor the amplitude of the signal in the loop and control the same through an amplitude stabilisation circuit.

The phase shifter 34 adjusts the phase of the signal coupled from the loop by the coupler 38 such that, at the carrier frequency of the oscillator 10, the signals appearing at the inputs of the mixer 32 are in quadrature.

The signal output from the mixer 32 is input to an electronic circuit 62 comprising a low noise amplifier 64 and a low pass filter 66. The signal output from the electronic circuit 62 is used as the control signal for the phase shifter 18. The phase shifter 18 induces a phase shift in the loop in response to the control signal such that noise close to the carrier frequency in the loop is suppressed.

Typically, noise is introduced into the signal in the loop by the microwave amplifier 12. When the signal is incident upon the resonator 14 the presence of the noise results in a dispersed signal in the form of a phase shifted reflected signal being directed by the circulator 22 into the carrier suppression means 30. The phase shift in the reflected signal results in the signals at the input ports 54 and 56 of the 3 dB 90° hybrid 46 not being in exact quadrature. Thus the signal present at the output port 58 is representative of the noise in the loop. Further, the signals appearing at the inputs to the mixer 32 will similarly not be in quadrature, resulting in a signal output from the mixer 32 corresponding to the noise in the loop. From the signal output from the mixer 32 the electronic circuit 62 produces the control signal for the phase shifter 18 such that the phase shifter 18 suppresses the noise close to the carrier in the loop.

Figure 2:
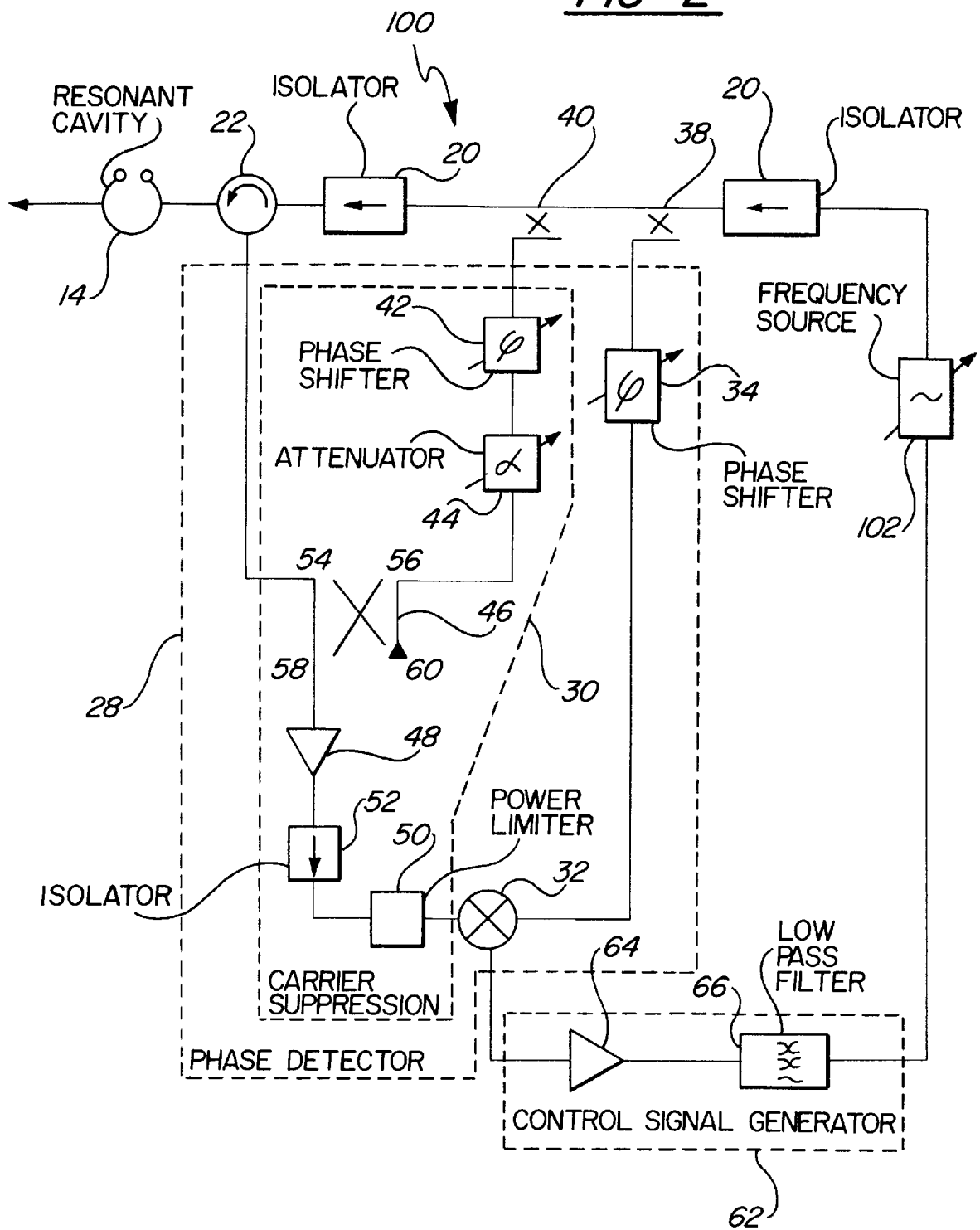
FIG. 2 is a schematic drawing of a cavity-stabilised oscillator incorporating a phase detector according to the second embodiment.

The embodiment shown in FIG. 2 is directed toward a phase detector used in a cavity stabilised oscillator, with like reference numerals denoting like parts to those shown in FIG. 1. The oscillator 100 shown in FIG. 2 includes a frequency source 102 which is input to the resonator 14. The signal output from the resonator 14 is used as an output. In effect, the frequency source 102 is locked to the resonator 14. The frequency source 102 is typically a frequency multiplied SAW oscillator, a dielectric resonator oscillator, a VCO, a YIG oscillator or the like. The frequency source 102 is controllable by a control signal. The phase detector 28 operates in the same manner as described in the first embodiment, in this embodiment producing a signal corresponding to the noise in the frequency source 102. The signal output from the mixer 32 is input to the electronic circuit 62 which produces the control signal for the frequency source 102. Thus, in this embodiment, the phase detector 28 is used to suppress noise in the frequency source 102 which is locked to the resonator 14.

Alternatively, the signal output from the mixer 32 could be used to measure the performance of the frequency source 102, since it represents the noise in the frequency source 102. Thus the present invention can be used to monitor phase noise in a signal or frequency source.

Figure 3:
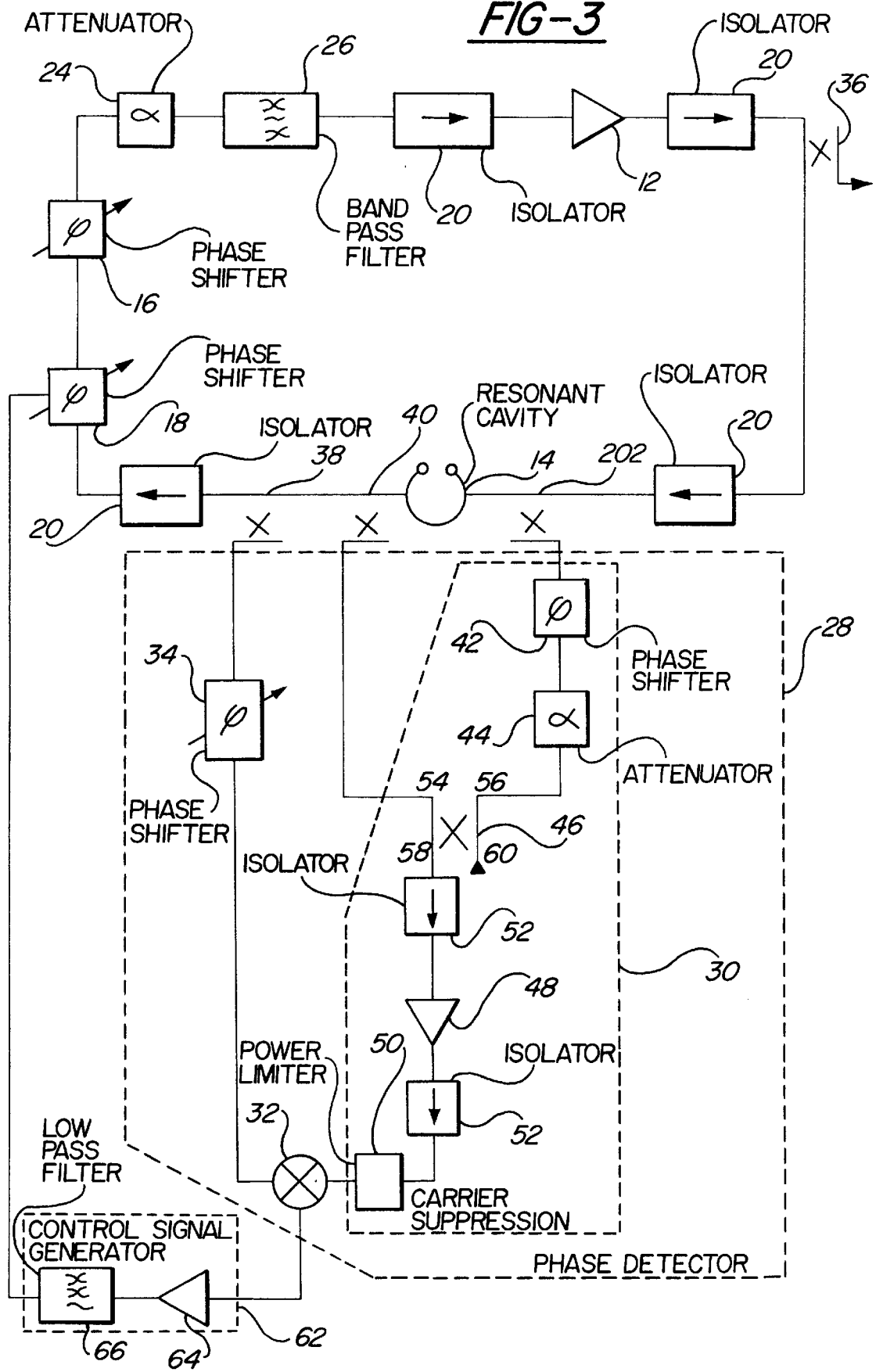
FIG. 3 is a schematic drawing of an alternative loop oscillator incorporating a phase detector according to the third embodiment.

A third embodiment of the invention in which a phase detector is used with a loop oscillator is shown in FIG. 3, with like reference numerals denoting like parts to those shown in FIG. 1. The embodiment shown in FIG. 3 differs from the embodiment shown in FIG. 1 in the position of the couplers 38 and 40 in the loop. In FIG. 3, the couplers 38 and 40 are positioned at the output of the resonator 14. Further, the circulator 22 in the first embodiment has been replaced by a coupler 202. Since couplers are directional, that is they couple signals travelling in a single direction only, the coupler 202 is arranged such that it couples the reflected signal from the resonator 14.

The couplers 38 and 40 may be positioned at the output of the resonator 14, as shown in FIG. 3, without substantially affecting the performance of the loop oscillator. The coupler 38 can be positioned anywhere in the loop. The couplers 40 and 202 must be positioned such that there is a difference between the signals coupled from the loop, which difference is a result of dispersion by the resonator 14.

Thus in the embodiment shown in FIG. 1, the coupler 40 produces a signal undispersed by the resonator 14 while the circulator 22 directs the reflected signal dispersed by the resonator 14 from the loop. In the embodiment shown in FIG. 3, the coupler 202 couples the reflected signal dispersed by the resonator 14 and the coupler 40 couples the signal output from the resonator 14. While the signal output from the resonator 14 has also been dispersed by the resonator 14, it has been dispersed to a different extent to the reflected signal. Consequently, the embodiment shown in FIG. 3 still provides improved noise performance.

However, if the couplers 202 and 40 were both positioned at the output of the resonator 14, the signals coupled by the couplers 202 and 40 would be the same, and the phase detector 28 would not function.

Figure 4:
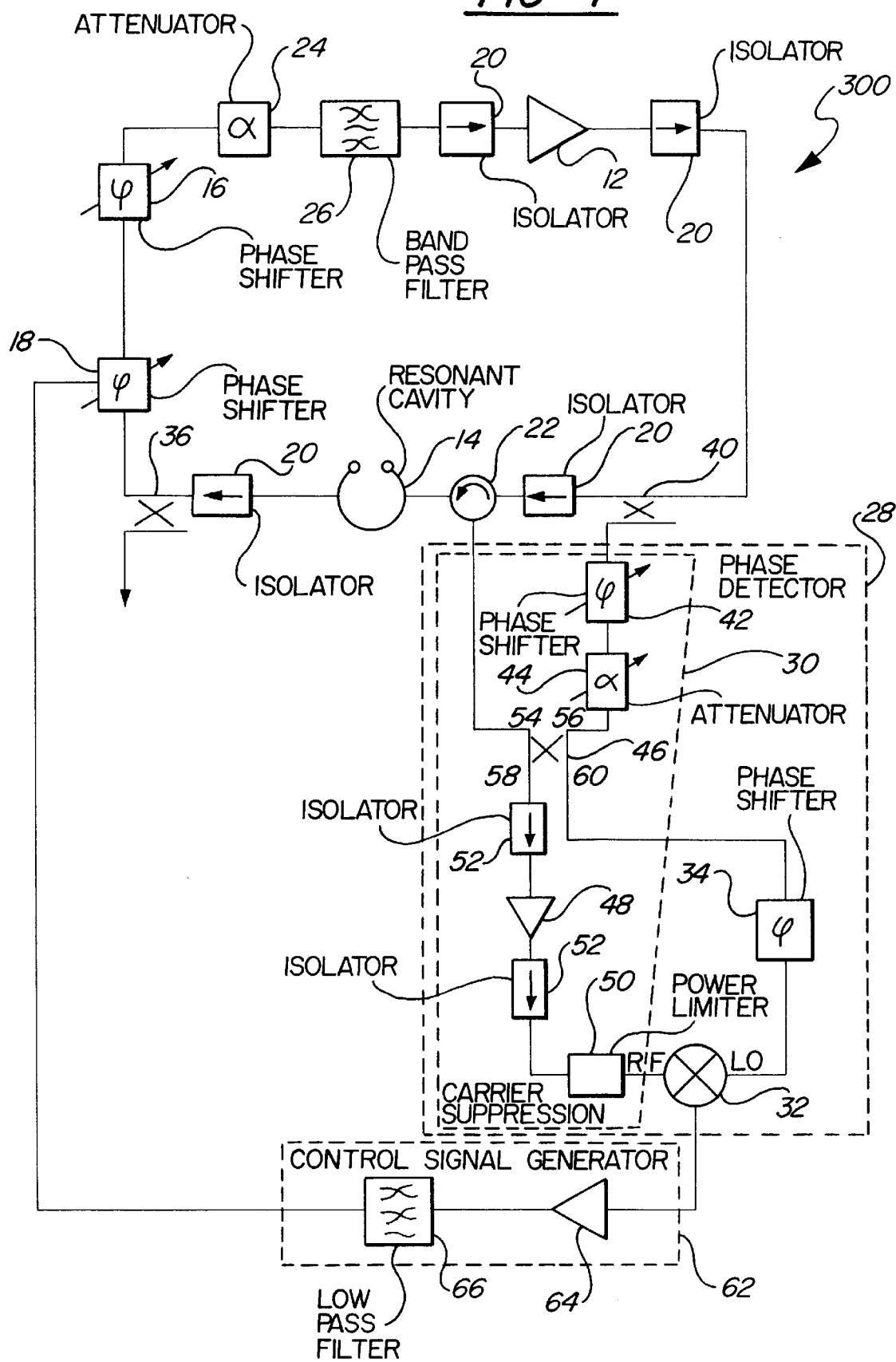
FIG. 4 is a schematic drawing of a further alternative loop oscillator incorporating a phase detector according to the fourth embodiment.

A fourth embodiment of the invention is shown in FIG. 4, with like reference numerals denoting like parts to those shown in FIG. 1. The embodiment shown in FIG. 4 is a phase detector used in another loop oscillator. The phase detector 28 shown in FIG. 4 differs from the phase detector shown in FIG. 1 in that the signal present at the output port 60 is passed through the phase shifter 34 and input to the mixer 32. Since the signal present at the output port 60 is predominantly the carrier frequency in the loop, it is suitable to be used in the LO input of the mixer 32. Thus in this embodiment, the need for the coupler 38 in the first embodiment has been eliminated, resulting in a more compact design.

It should be appreciated that the scope of the present invention is not limited to the embodiments described above.

In particular, the power combiner can take forms other than a 3 dB 90° hybrid, such as a Wilkinson power combiner, or a 6 dB or 10 db coupler. If the microwave oscillator was manufactured in microstrip form, an impedance transformer can be used as the power combiner.

We claim:

1. A phase detector responsive to a first signal having a carrier frequency and a second signal, comprising a carrier suppression means responsive to the first and second signals, the second signal having a frequency such that the carrier suppression means produces a carrier suppressed signal from the first and second signals, mixing means response to the carrier suppressed signal and the carrier frequency to produce an output signal corresponding to the phase difference between the first and second signals, wherein an amplifier is provided between the carrier suppression means and the mixing means.

2. A phase detector as claimed in claim 1, wherein the carrier frequency is sufficiently suppressed in the carrier suppressed signal that noise introduced by the amplifier and the mixing means is less than noise that would be introduced by the mixing means alone.

3. A phase detector as claimed in claim 1, wherein the carrier suppression means comprises a power combiner, a phase shift means and an amplitude matching means, the phase shift means and the amplitude matching means arranged to be operative on the first and second signals before being input to the power combiner such that the power combiner produces the carrier suppressed signal from the first and second signals.

4. A phase detector as claimed in claim 3, wherein the amplitude matching means comprises an attenuator.

5. A phase detector as claimed in claim 3, wherein the power combiner comprises a 3 dB 90° hybrid.

6. A phase detector as claimed in claim 1, wherein the mixing means comprises a double balanced mixer.

7. A phase detector as claimed in claim 1, wherein the second signal comprises a signal reflected from a frequency dispersive element in response to the first signal being incident thereon.

8. A phase detector as claimed in claim 1, wherein the second signal comprises a signal output from a frequency dispersive element in response to the first signal being incident thereon.

9. A phase detector as claimed in claim 7 or 8, wherein the frequency dispersive element comprises a resonator.

10. A phase detector as claimed in claim 9, wherein the resonator is close to critically coupled.

11. An oscillator including a phase detector as claimed in claim 1, wherein the first signal is a signal in the oscillator, the output signal from the phase detector being fed back to suppress noise close to the carrier frequency in the oscillator.

12. An oscillator as claimed in claim 11, wherein the carrier suppression means comprises a power combiner, a phase shift means and an amplitude matching means, the phase shift means and the amplitude matching means arranged to be operative on the first and second signals before being input to the power combiner such that the power combiner produces the carrier suppressed signal from the first and second signals.

13. An oscillator as claimed in claim 11, wherein the second signal comprises a signal reflected from a frequency dispersive element in response to the first signal being incident thereon.

14. An oscillator as claimed in claim 11, wherein the second signal comprises a signal output from a frequency dispersive element in response to the first signal being incident thereon.

15. An oscillator as claimed in claim 13 or 14, wherein the frequency dispersive element comprises a resonator.

16. An oscillator as claimed in claim 15, wherein the resonator is close to critically coupled.

17. An oscillator as claimed in claim 13 or 14, wherein the frequency dispersive element forms part of the oscillator.

18. An oscillator as claimed in claim 17, wherein the oscillator is a loop oscillator including an amplifier and a phase-shift means responsive to a control signal, the amplifier, the phase-shift means and the frequency dispersive element being arranged in a loop, the output signal from the phase detector being input to an electronic circuit which produces therefrom the control signal for the phase-shift means such that the phase-shift means suppresses noise close to the carrier frequency in the loop oscillator.

19. An oscillator as claimed in claim 11, wherein the oscillator includes a frequency source responsive to a control signal, the frequency source producing the first signal, wherein the output signal from the phase detector is input to an electronic circuit which produces the control signal for the frequency source, the control signal adjusting the frequency of the frequency source to suppress noise close to the carrier frequency in the frequency source.

20. An oscillator as claimed in claim 11, wherein the oscillator is a microwave oscillator.

21. A method of detecting a phase difference between a first signal having a carrier frequency and a second signal, comprising the steps of:

adjusting the phase of the first signal and/or the second signal such that, at the carrier frequency, the first and second signals have a predetermined phase difference;

adjusting the amplitudes of the first signal and/or the second signal such that, at the carrier frequency, the first and second signals have substantially equal amplitude;

combining the first and second signals to produce a carrier suppressed signal;

amplifying the carrier suppressed signal; and mixing the amplified carrier suppressed signal with the carrier frequency to produce an output signal corresponding to the phase difference between the signals.

22. A method of detecting a phase difference as claimed in claim 21, wherein the carrier frequency is sufficiently suppressed in the carrier suppressed signal that noise introduced by the steps of amplifying and mixing is less than noise that would be introduced by mixing alone.

23. A method of detecting a phase difference as claimed in claim 21, wherein the second signal comprises a signal reflected from a frequency dispersive element in response to the first signal being incident thereon.

24. A method of detecting a phase difference as claimed in claim 21, wherein the second signal comprises a signal output from a frequency dispersive element in response to the first signal being incident thereon.

25. A method of detecting a phase difference as claimed in claim 23 or 24, wherein the frequency dispersive element comprises a resonator.

26. A method of detecting a phase difference as claimed in claim 25, wherein the resonator is close to critically coupled.

27. A method of detecting a phase difference as claimed in claim 21, wherein the phase difference between the first and second signals is adjusted by passing one of the first and second signals through a phase shifter to alter the phase of that signal by a predetermined amount.

28. A method of detecting a phase difference as claimed in claim 21, wherein the relative amplitude of the first and second signals is adjusted by passing one of the first and second signals through an attenuator to attenuate the amplitude of that signal by a predetermined amount.

29. A method of detecting a phase difference as claimed in claim 21, wherein the first and second signals are combined by passing them through a power combiner, the power combiner producing the carrier suppressed signal from the first and second signals.

30. A method of detecting a phase difference as claimed in claim 29, wherein the power combiner comprises a 3 dB 90° hybrid.

31. A method of detecting a phase difference as claimed in claim 21, wherein the carrier suppressed signal is mixed by passing the carrier suppressed signal and the carrier frequency into a double balanced mixer.

* * * * *

UNITED STATES PATENT AND TRADEMARK OFFICE
CERTIFICATE OF CORRECTION

PATENT NO.   : 5,841,322
DATED        : November 24, 1998
INVENTOR(S)  : Eugene Nikolay Ivanov et al.

It is certified that error appears in the above-identified patent and that said Letters Patent is hereby corrected as shown below:

On the title page insert [73] to read as follows:

Assignee:    Poseidon Scientific Instruments Pty Ltd
                        Western Australia, Australia

The University of Western Australia
                        Western Australia, Australia

On the title page After "Primary Examiner" add Attorney, Agent, or Firm --Bliss McGlynn, P.C.--

Signed and Sealed this

Twenty-fourth Day of August, 1999

*Attest:*

Q. TODD DICKINSON

*Attesting Officer*      *Acting Commissioner of Patents and Trademarks*